(12) United States Patent
Lo et al.

(10) Patent No.: US 8,927,370 B2
(45) Date of Patent: Jan. 6, 2015

(54) METHOD FOR FABRICATING MEMORY

(75) Inventors: Chun-Yuan Lo, Hsinchu (TW); Chun-Pei Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1744 days.

(21) Appl. No.: 11/459,416

(22) Filed: Jul. 24, 2006

(65) Prior Publication Data
US 2008/0020525 A1 Jan. 24, 2008

(51) Int. Cl.
*H01L 21/8234* (2006.01)
*H01L 27/105* (2006.01)
*H01L 27/115* (2006.01)

(52) U.S. Cl.
CPC ............ *H01L 27/105* (2013.01); *H01L 27/115* (2013.01); *H01L 27/11526* (2013.01); *H01L 27/11546* (2013.01)
USPC .................... 438/275; 438/264; 257/E21.689

(58) Field of Classification Search
None
See application file for complete search history.

(56) References Cited

U.S. PATENT DOCUMENTS

| | | | | |
|---|---|---|---|---|
| 6,133,096 A | * | 10/2000 | Su et al. | 438/264 |
| 6,531,731 B2 | * | 3/2003 | Jones et al. | 257/314 |
| 7,341,914 B2 | * | 3/2008 | Prinz et al. | 438/260 |

\* cited by examiner

*Primary Examiner* — Laura Menz
*Assistant Examiner* — Candice Y Chan
(74) *Attorney, Agent, or Firm* — J.C. Patents

(57) ABSTRACT

A method for fabrication a memory having a memory area and a periphery area is provided. The method includes forming a gate insulating layer over a substrate in the periphery area. Thereafter, a first conductive layer is formed in the memory area, followed by forming a buried diffusion region in the substrate adjacent to the sides of the first conductive layer. An inter-gate dielectric layer is then formed over the first conductive layer followed by forming a second conductive layer over the inter-gate dielectric layer. A transistor gate is subsequently formed over the gate insulating layer in the periphery area.

5 Claims, 13 Drawing Sheets

METHOD FOR FABRICATING MEMORY

BACKGROUND OF THE INVENTION

1. Field of Invention

The present invention relates to a method for fabricating a semiconductor device. More particularly, the present invention relates to a method for fabricating a memory having a memory area and a periphery area.

2. Description of Related Art

As the development of semiconductor technology advances for increasing the integration of semiconductor devices, the line width of the semiconductor devices must be reduced. Consequently, a variety of problems arise as the size of the cell of the memory device is miniaturized. For example, as the line width of the memory device reduced, the channel length between the source and the drain is correspondingly reduced leading to a short channel effect. The short channel effect is a result of the reduction in the threshold voltage and the increase in the sub-threshold current.

Conventionally, a memory involves integrating memory cell arrays and logic circuit elements onto a single chip. The logic circuit elements may include high voltage devices and low voltage devices. The prior art method involves first forming an tunnel oxide layer and a first polysilicon layer in the memory array area, followed by forming the buried diffusion regions in the substrate adjacent to the tunnel oxide layer and the first polysilicon layer. Thereafter, an inter-gate dielectric layer, for example an oxide-nitride-oxide (ONO) film, is formed on the first polysilicon layer. Subsequently, thermal oxidation processes are respectively performed to form the gate insulating layers for the high voltage devices and the low voltage devices in the logic circuit area. A second conductive layer is eventually formed over the inter-gate dielectric layer, followed by patterning the second conductive layer and inter-gate dielectric layer and the first conductive layer in the memory array area to form an array of memory cells.

Accordingly, subsequent to the formation of the buried diffusion region in the semiconductor substrate, the high thermal budget processes, such as the fabrication process of the thick gate insulating layers for the high voltage devices, can seriously affect the size of the buried diffusion region. In essence, the high temperature in the thermal processes leads to an expansion of the buried diffusion region. Consequently, the short channel effect is acerbated and the device characteristics of the memory are difficult to control.

Moreover, in the conventional manufacturing process of a memory, it is customary to perform a series of process steps subsequent to the fabrication of the inter-gate dielectric layer and before the fabrication of the control gate layer. The inter-gate dielectric layer can potentially be damaged induced in other process steps. Consequently, the quality of the device is compromised.

SUMMARY OF THE INVENTION

In view of the foregoing, the present invention provides a method for fabricating a memory in which the expansion of the buried diffusion region is prevented. Ultimately, the short channel effect is mitigated.

The present invention also provides a method for fabricating a memory, wherein the size of the buried diffusion region remains unaffected by the thermal process for forming the gate insulating layer of the transistors in the periphery circuit region. As a result, the device characteristics of the memory are better controlled.

Additionally, the present invention provides a method for fabricating a memory in which the inter-gate dielectric layer formed between two gate layers is prevented from being compromised during the fabrication process of the memory. Accordingly, the quality and the property of the inter-gate dielectric layer are better preserved.

The fabrication method of a memory of the present invention includes providing a semiconductor substrate having a memory area and a periphery area, wherein the periphery area is further divided into at least a high voltage region (HV) and a low voltage region (LV). A gate dielectric film is first fabricated in the periphery area, wherein the thickness of a part of the gate dielectric film in the high voltage transistor region is greater than the thickness of another part of the gate dielectric film in the low voltage transistor region. The gate dielectric film is formed by performing thermal processes, for example. A first conductive layer is then formed over the gate dielectric film in the periphery area. In one aspect of the invention, a first dielectric layer may form over the first conductive layer. The first conductive layer is formed with a material that includes but not limited to polysilicon. Subsequent to the formation of the gate dielectric film and the first conductive layer in the periphery area, a second dielectric layer is formed over the memory array area, followed by forming a second conductive layer over the second dielectric layer. The second dielectric layer may include an oxide material and is formed by performing a thermal process, for example. The second conductive layer may include but not limited to a polysilicon layer. After this, a third dielectric layer is formed over the second conductive layer. The third dielectric layer is formed with a material that includes but not limit to silicon nitride. The third dielectric layer and the second conductive layer in the memory array area are then patterned to form multiple rows of stack structures. A plurality of buried diffusion lines are further formed in the semiconductor substrate adjacent to the sides of the rows of stack structures. The buried diffusion lines, which constitute either source lines or drain lines, are formed by implanting dopants in the substrate, for example. Subsequently, a fourth dielectric layer is formed over the buried drain diffusion lines between the rows of stack structures in the memory array area. The fourth dielectric layer is formed with an oxide material, for example, and is formed by methods include but not limited to high density plasma deposition. In one aspect of the invention, a patterned third conductive layer may also form over the second conductive layer and the fourth dielectric layer in the memory area, wherein a part of the top surface of the fourth dielectric layer is exposed. Thereafter, a fifth dielectric layer is formed over the semiconductor substrate of the memory area. A material that constitutes the fifth dielectric may include an oxide-nitride-oxide (ONO) film. The fifth dielectric layer may serve as an inter-gate dielectric layer, for example. A fourth conductive layer is further formed over the fifth dielectric layer. In one embodiment, the fourth conductive layer is also formed in the periphery area. Subsequently, the fourth conductive layer, the fifth dielectric layer, the third conductive and the second conductive layer are patterned to form a plurality of rows and columns of memory devices in the memory area. Eventually, the first conductive layer in the periphery area is patterned to form a multiple of transistor gates.

According to one aspect of the invention, the gate dielectric film is formed by performing a first thermal process to form the gate dielectric film in both the high voltage region and the low voltage region. The gate dielectric film in the low voltage region is then removed. After this, a second thermal process is performed to form the gate dielectric film in the low voltage region.

According to another aspect of the invention, the step of forming the fourth dielectric layer between the rows of stack structures includes forming the fourth dielectric layer over the third dielectric layer of the stack structures and between the rows of stack structures. A wet dip etch process is then performed to remove a portion of the fourth dielectric layer until a top edge of the third dielectric layer is exposed. Then, the third dielectric layer is removed, wherein the portion of the fourth dielectric layer disposed over the third dielectric layer is also removed.

According to yet another aspect of the invention, the first conductive layer and the first dielectric layer are also formed in the periphery area and are subsequently removed using a patterned mask. Wherein the same patterned mask is used in the removal of the fourth conductive layer in the periphery area before the formation of the transistor gates.

In the present invention, the fabrication of the gate dielectric film for the high voltage devices in the periphery area proceeds the formation of the buried diffusion region in the memory area. Therefore, the size of the buried diffusion region remains unaffected by the thermal process used in forming the gate dielectric film of the transistors in the periphery area. The expansion of the buried diffusion region is thus confined. Accordingly, the short channel effect can be minimized. Further, the device characteristics of the memory can be better controlled.

Moreover, the fourth conductive layer is formed substantially right after the formation of the inter-gate dielectric layer of the memory devices. As a result, the inter-gate dielectric layer remains uncompromised by other processes of the fabrication of the memory. Ultimately, the quality and the property of the inter-gate dielectric layer can be better maintained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
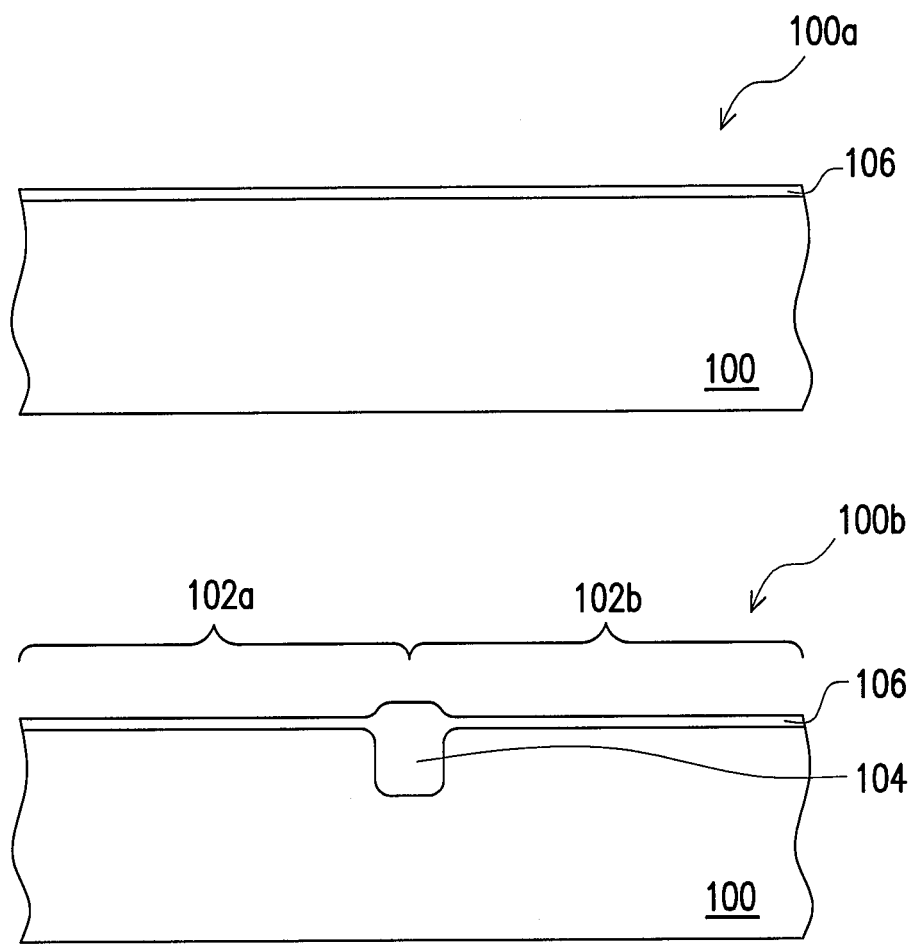
FIGS. 1A-1L and 1E'-1H' are cross-sectional views showing selected process steps for fabricating a memory comprising a memory array area and a corresponding periphery circuit area in accordance to one embodiment of the invention, wherein FIGS. 1E'-1H' are cross-sectional views of the memory array area 100a observed from a perpendicular direction from the viewing angle of FIGS. 1E-1H, respectively.
Figure 1B:
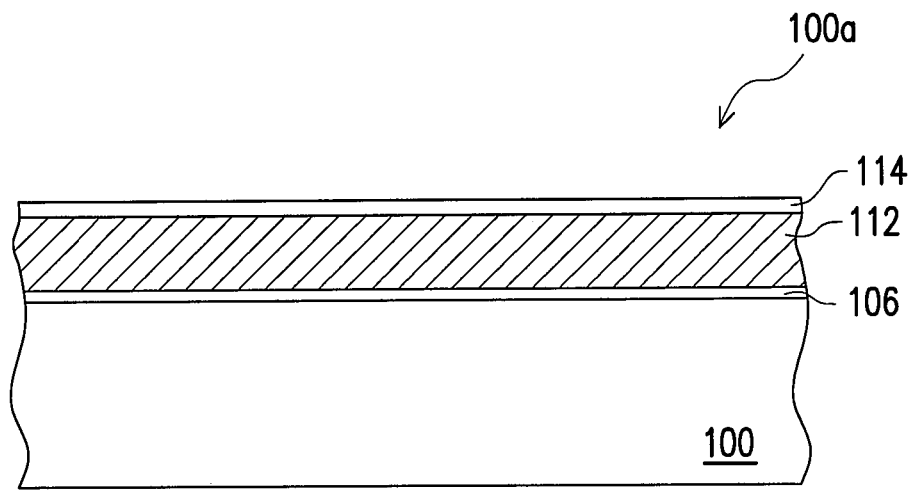
Figure 1B:
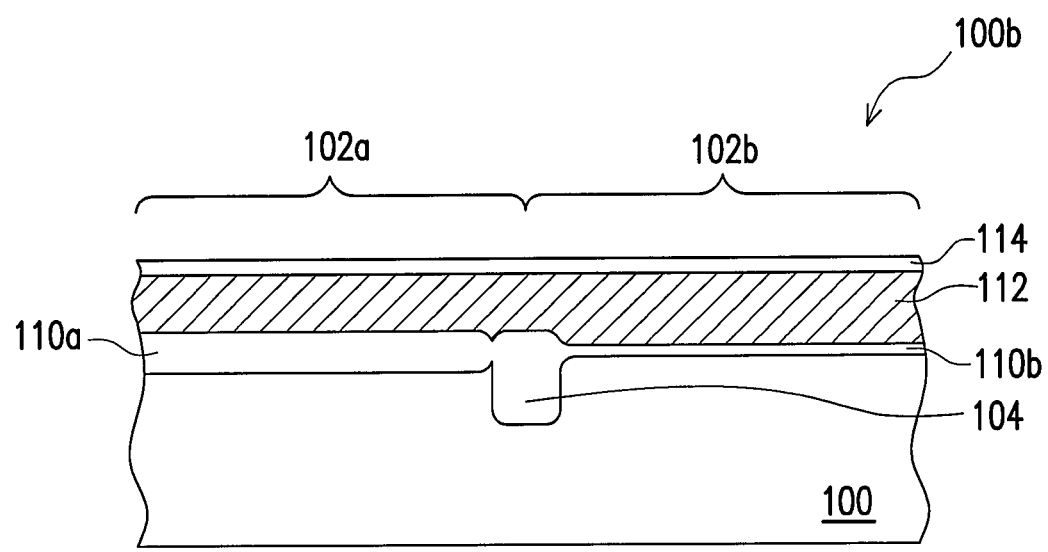
Figure 1C:
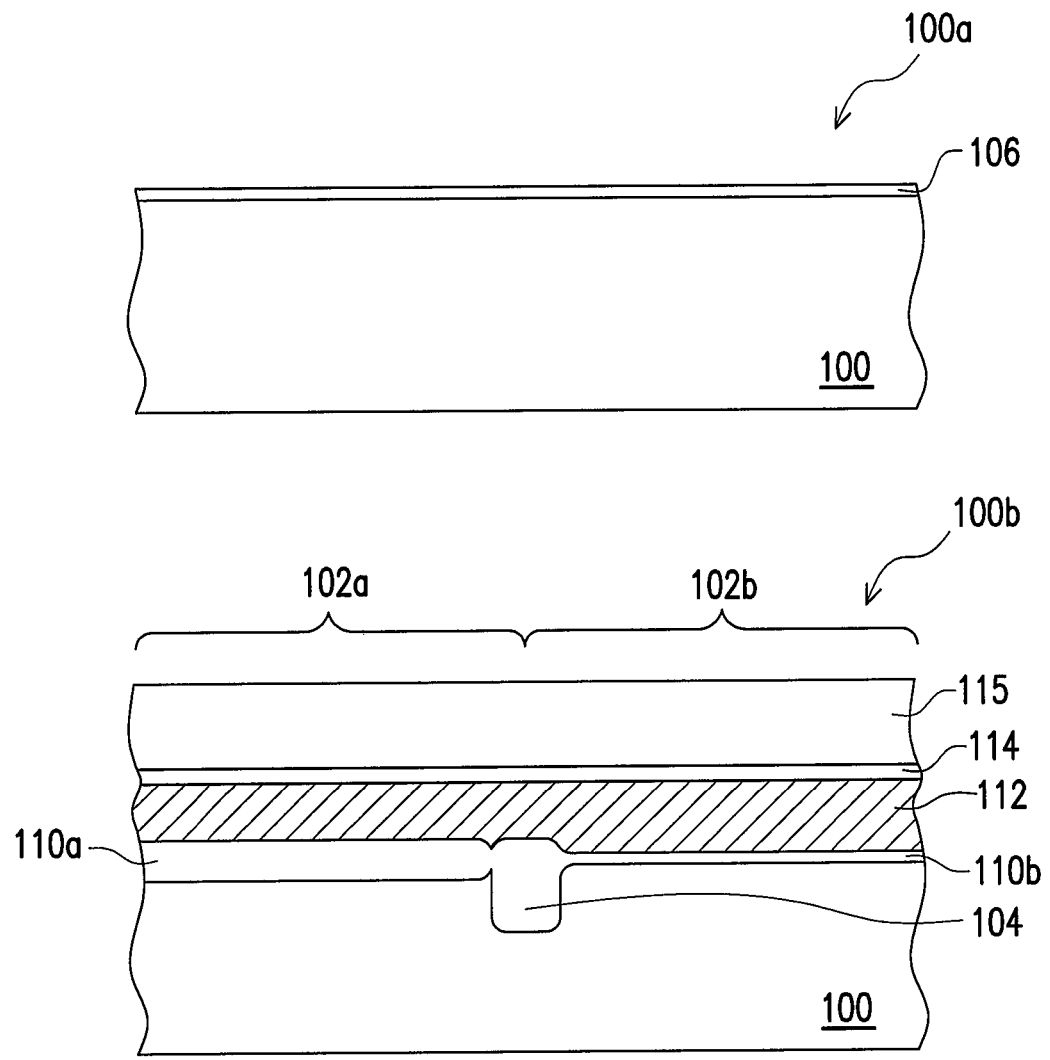
Figure 1D:
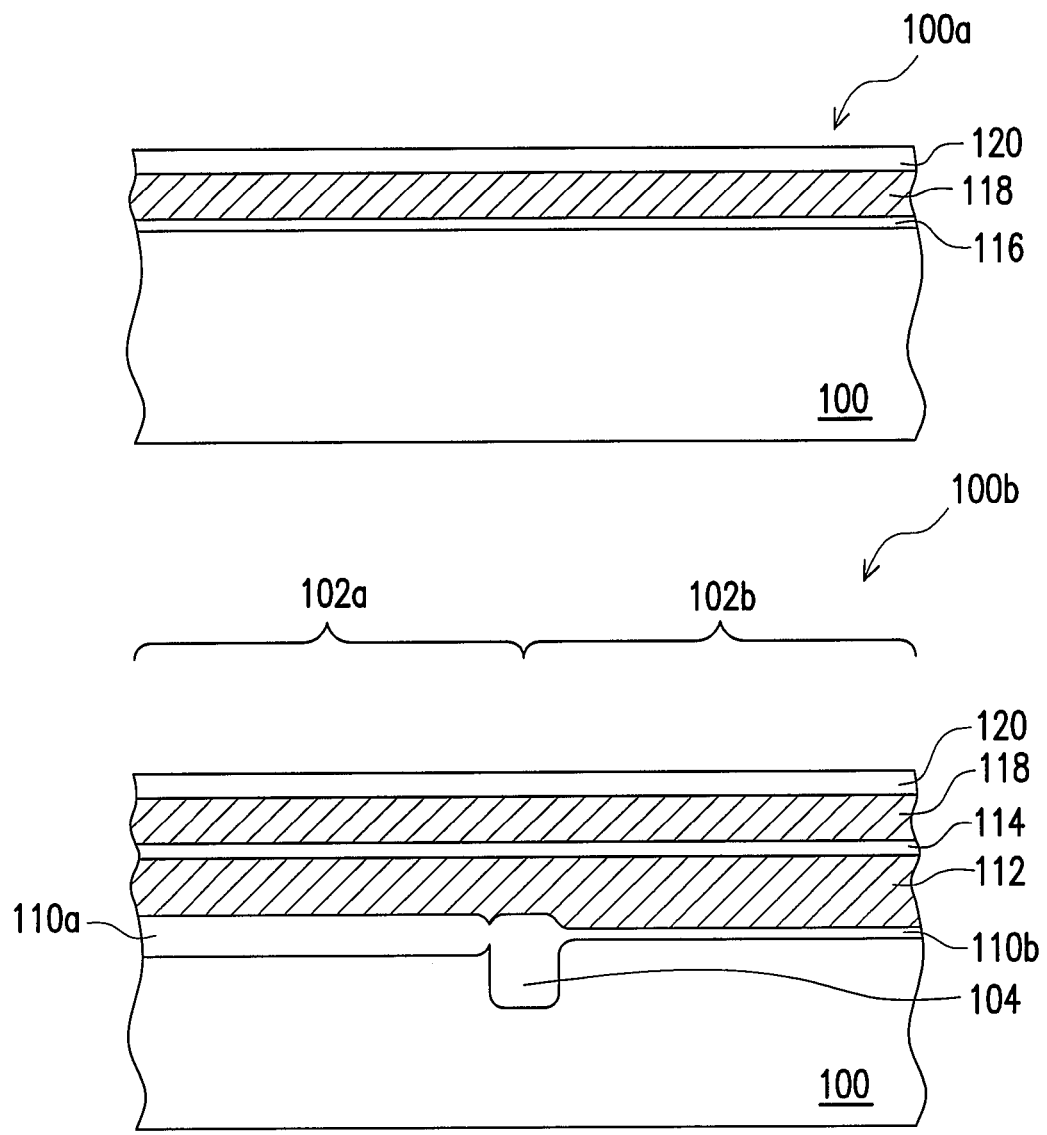
Figure 1E:
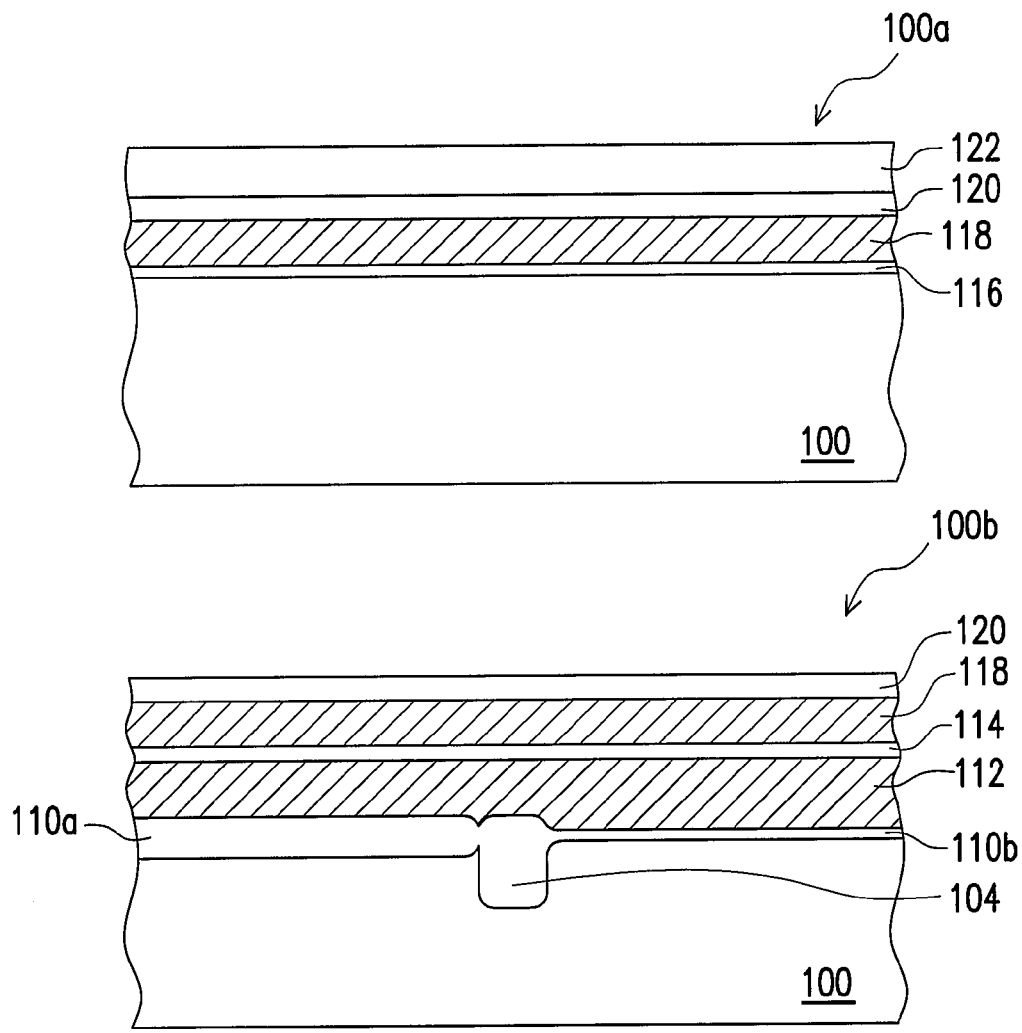
Figure 1E:
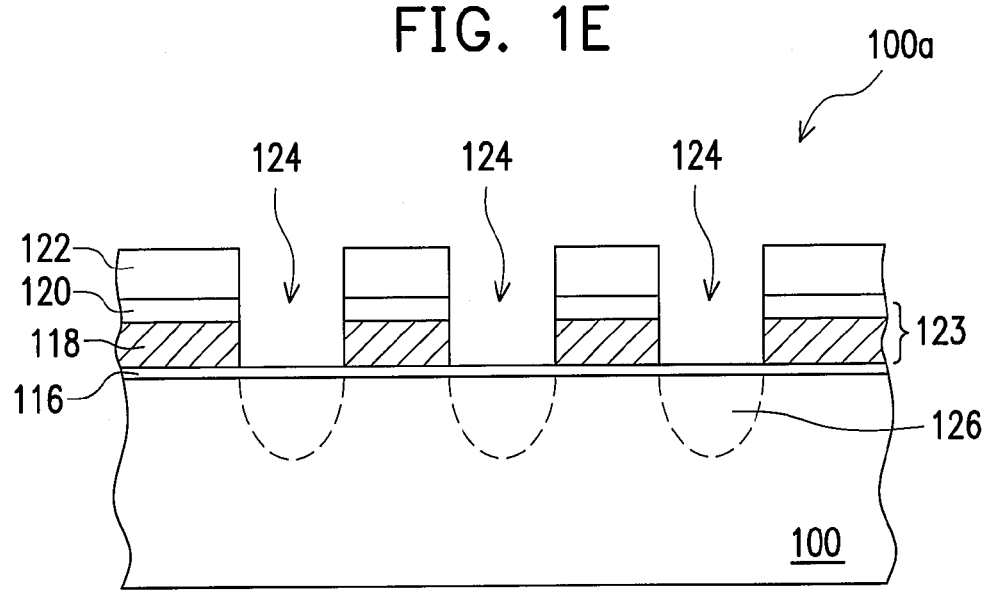

FIGS. 1A-1L and 1E'-1H' are cross-sectional views showing selected process steps for fabricating a memory comprising a memory array area and a corresponding periphery circuit area in accordance to one embodiment of the invention. FIGS. 1E'-1H' are cross-sectional views of the memory array area observed from a perpendicular direction from the viewing angle of FIGS. 1E-1H, respectively. Referring to FIG. 1A, a semiconductor substrate 100 is provided. The semiconductor substrate 100 may be a silicon wafer, for example. The surface of the semiconductor substrate 100 is divided into at least a memory array area 100a and a periphery circuit area 100b formed adjacent to the memory array area 100a. The periphery circuit area 100b, for example, a logic circuit area, may further divide into a high voltage transistor region (HV) 102a and a low voltage transistor region (LV) 102b. Additionally, the memory array area 100a may form within a cell well (not shown), while the high voltage transistor region (HV) 102a and the low voltage transistor region (LV) 102b may form within different wells (not shown) with different conductive types. The wells may be either an N-well for forming PMOS devices or P-well for forming NMOS devices. Isolation structures 104, for example, shallow trench isolation structures, are used to separate the different regions and areas. A dielectric layer 106 is formed over the semiconductor substrate 100 in both areas 100a, 100b. The dielectric layer 106 can be an oxide layer, for example.

Referring to FIG. 1B, a thick dielectric film is to be provided on the high voltage transistor region 102a and a thin dielectric film is to be provided on the low voltage transistor region 102b. The Dual Gate process is proceeded as follows. The dielectric layer 106 is removed. The method for removing the dielectric layer 106 includes but not limited to performing a wet etching process. Then a thermal process is performed to form gate dielectric layer 110a. Thereafter, a patterned mask (not shown) is formed, wherein this patterned mask conceals the high voltage transistor region 102a of the periphery circuit area 100b while exposes the low voltage transistor region 102b. The dielectric layer 110a formed in the low voltage transistor region 102b is then removed. The method for removing the dielectric layer 110a includes but not limited to performing a wet etching process. The patterned mask formed to conceal the high voltage transistor region 102a is subsequently removed. Still referring to FIG. 1B, a thermal process is again performed to form a dielectric layer 110b over substrate 100 of the low voltage transistor region (LV) 102b. In one embodiment, the dielectric layer 110a in the high voltage region 102a may concurrently provide with an additional thickness. The dielectric layer 110b is, for example, an oxide layer formed with a thickness of about 20 to 100 angstroms. The dielectric layer 110b is formed by growing in an oxidation furnace, for example.

Thereafter, a conductive layer 112 is formed over the dielectric layer 106 in the memory array area 100a and over the dielectric layers 110a, 110b in the periphery circuit area 100b. The conductive layer 112 includes but not limit to a polysilicon layer. A dielectric layer 114 is further formed on the conductive layer 112. A material of the dielectric layer 114 includes but not limited to silicon nitride.

Continuing to FIG. 1C, a patterned mask layer 115 is formed over semiconductor substrate 100, wherein the patterned mask layer 115 conceals the periphery circuit area 100b and exposes the memory array area 100a. Using the patterned mask layer 115 as an etching mask, the dielectric layer 114 and the underlying conductive layer 112 in the memory array area 100a are sequentially removed. In one embodiment, a channel implantation may also perform to dope the substrate 100 in the memory array area 100a subsequent to the removal of the dielectric layer 114 and the conductive layer 112.

Referring to FIG. 1D, the patterned photomask layer 115 covering the periphery circuit area 100b is removed. A dielectric layer 116 is then formed on the semiconductor substrate 100 in the memory array area 100a. The dielectric layer 116, which may serve as a gate insulating layer, is formed of silicon oxide to a thickness of the order of about 100 angstroms, for example. One method of forming the dielectric layer 116 is by thermal oxidation for example. In one embodiment, a cleaning process, for example, a pre-gate oxide cleaning process, may perform to clean the memory array area 100a proceeding the formation of the dielectric layer 116. Subsequently, a conductive layer 118 is formed over the memory array area 100a and the periphery circuit area 100b. The conductive layer 118 is constituted with a material, such as polysilicon, and is formed through methods including but not limited to chemical vapor deposition (CVD), low pressure chemical vapor deposition (LPCVD) and sputtering. After this, a dielectric layer 120 is formed over the conductive layer 118 in both the memory array area 100a and the periphery circuit area 100b. The dielectric layer 120 includes but not limited to a silicon nitride layer. The dielectric layer 120 is formed by deposition methods, for example.

Referring to both FIGS. 1E and 1E', wherein FIG. 1E' illustrates a cross-sectional view of the memory array area 100a observed from a perpendicular direction from the viewing angle of FIG. 1E. As shown in FIGS. 1E and 1E', a patterned mask layer 122 is formed over the entire semiconductor substrate 100, covering the periphery circuit area 100b and a portion of the memory array area 100a. Using the patterned mask layer 122, the dielectric layer 120 and the conductive layer 118 are defined within the memory array area 100a to form multiple rows of stack structures 123 as shown in FIG. 1E', wherein a space 124 is configured between every two adjacent rows of the stack structures to expose a part of the dielectric layer 116 in the memory array area 100a. Still referring to FIG. 1E', buried diffusion lines 126 are then formed in the semiconductor substrate 100 under the exposed dielectric layer 116 adjacent to the sides of the rows of the stack structure 123. The buried diffusion lines 126 which constitute either the source lines or the drain lines are formed by implanting dopants in the substrate 100. In one embodiment, the buried diffusion lines are formed by performing an ion implantation process using N-type dopants, for example.

Figure 1F:
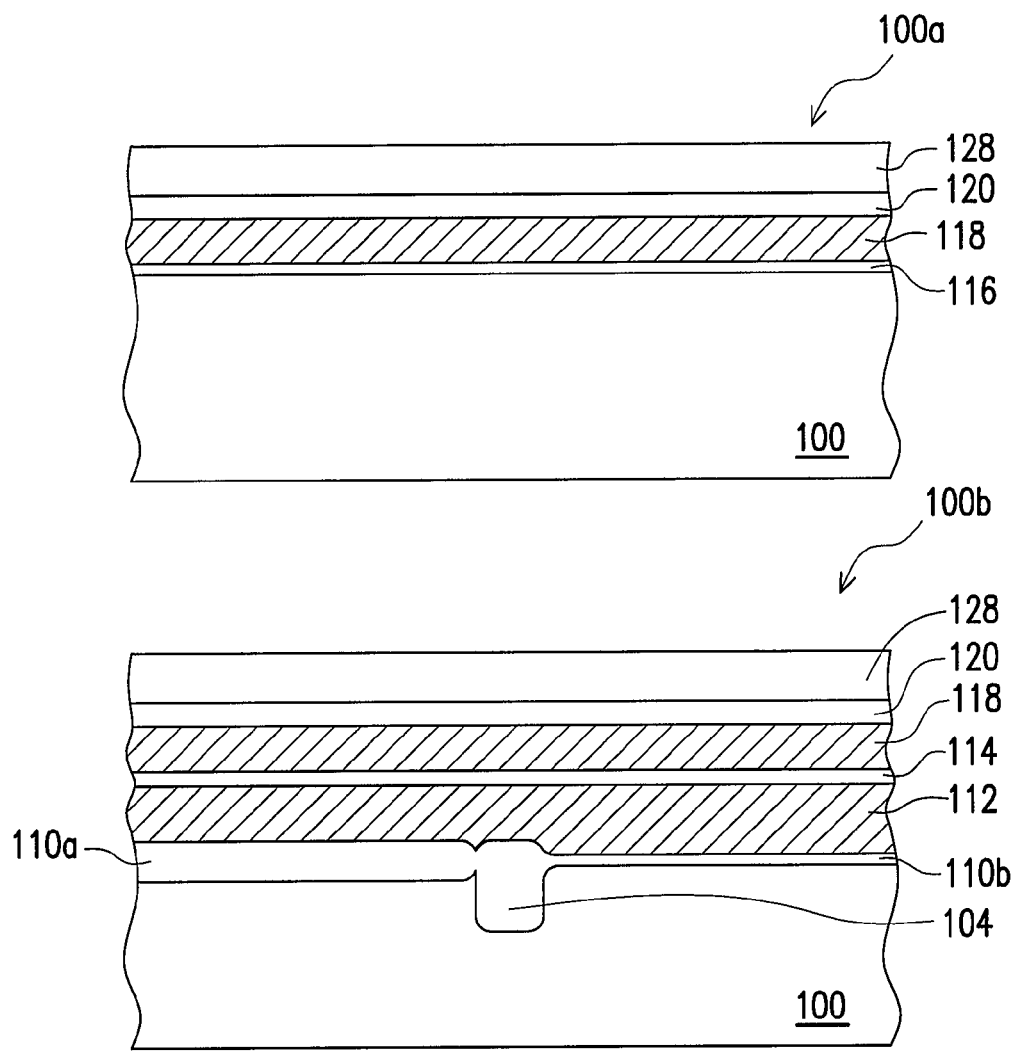
Figure 1F:
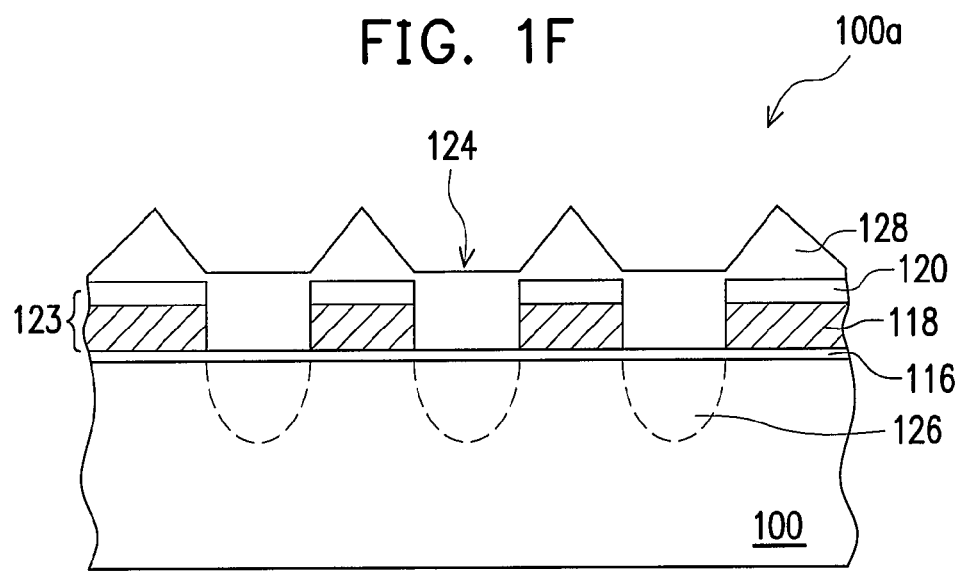

Continuing to FIGS. 1F and 1F', wherein FIG. 1F' illustrates a cross-sectional view of memory array area 100a observed from a perpendicular direction from the viewing angle of FIG. 1F. As shown in FIGS. 1F and 1F', the patterned mask layer 122 is removed. A dielectric layer 128 is then formed over the semiconductor substrate 100. The dielectric layer 128 covers the dielectric layer 120 in both memory array area 100a and the periphery circuit area 100b. Further, the dielectric layer 128 fills the space 124 between the rows of the stack structures 123 in the memory array area 100a. In this embodiment, the dielectric layer 128 is, for example, an oxide layer formed by high density plasma (HDP) deposition methods. It is also worthy to note that the topographic surface of the dielectric layer 128 exhibits a raised profile above the dielectric layer 120 of each row of the stack structures.

Figure 1G:
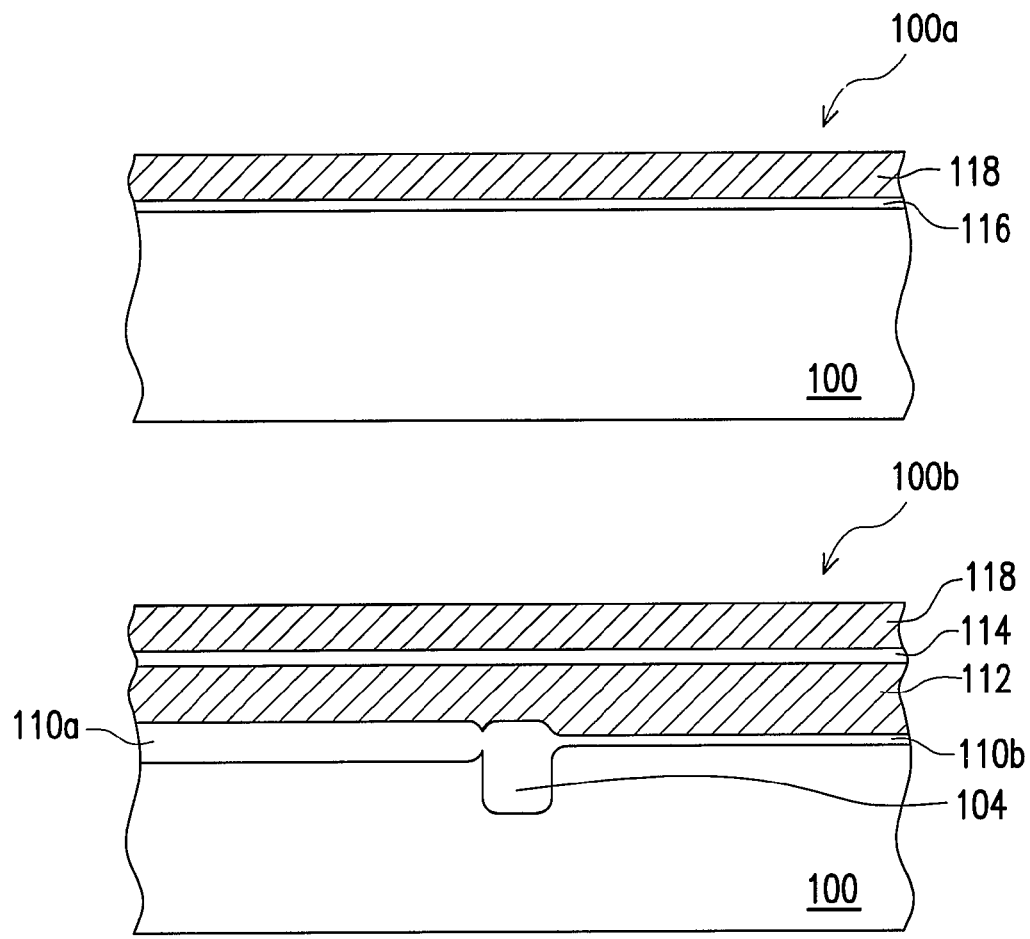
Figure 1G:
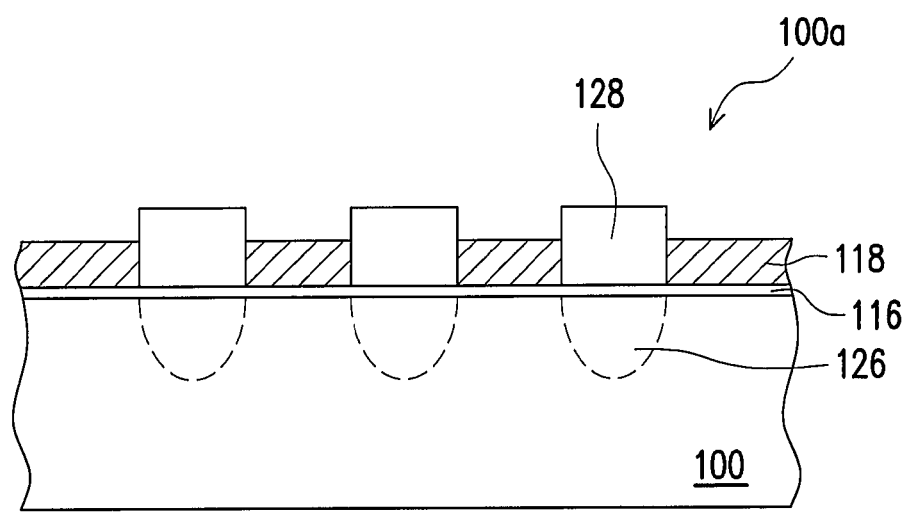

Referring to FIGS. 1G and 1G', a patterned mask layer (not shown) is formed, covering the memory array area 100a. Using the patterned mask layer as an etching mask, the dielectric layer 128 in the periphery circuit area 100b is removed. After removing the patterned mask, a wet dip etch process is performed to remove a portion of the dielectric layer 128 in the memory array area 100a. It is worthy to note that subsequent to the wet dip etch process, the raised profile of the dielectric layer 128 is diminished in size and the height of the dielectric layer 128 formed between the rows of the stack structures 123 is also reduced to expose the top edge of the dielectric layer 120.

Still referring to FIGS. 1G and 1G', an etching process, for example, is performed to remove the dielectric layer 120 in both the memory array area 100a and the periphery circuit area 100b. In the case that the dielectric layer 120 is a silicon nitride layer, the dielectric layer 120 is removed by wet etching using hydrofluoric acid as an etchant. Consequently, the part of the dielectric layer 128 with the raised profile above the dielectric layer 120 of each row of the stack structures in the memory array area 100a is lifted-off due to the dissolution of the underlying dielectric layer 120. On the other hand, the part of the dielectric layer 128 formed between the conductive layer 118 of the stack structures 130 is retained. In one embodiment, the height of the remaining dielectric layer 128 is higher than that of the conductive layer 118.

Figure 1H:
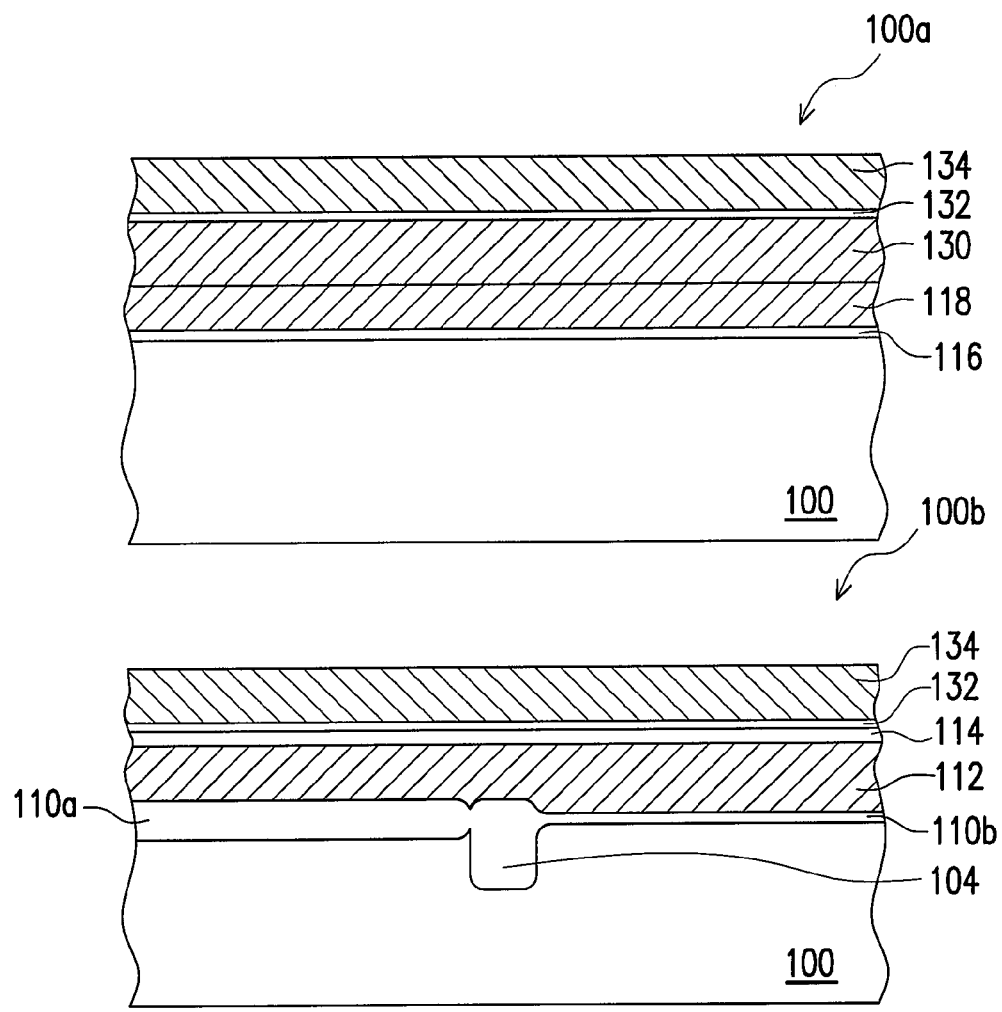
Figure 1H:
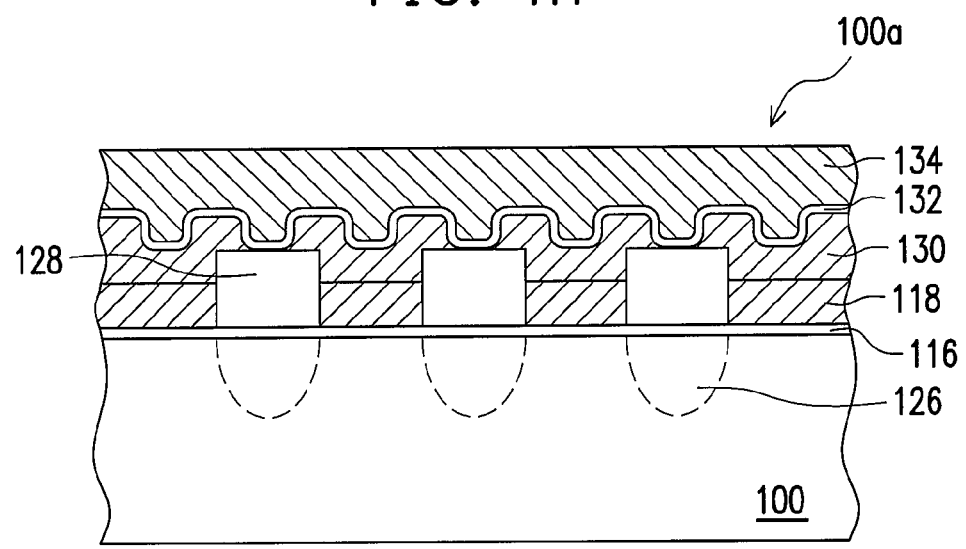

Continuing to FIGS. 1H and 1H', a conductive layer 130 is formed in both the memory array area 100a and the periphery circuit area 100b. The conductive layer 130 is formed over the conductive layer 118 and the remaining dielectric layer 128 in the memory array area 100a. The conductive layer 130 is also formed over the conductive layer 118 in the periphery circuit area 100b. In one embodiment, the conductive layer 130 is, for example, a polysilicon layer, which is formed by methods including but not limited to chemical vapor deposition (CVD), low pressure chemical vapor deposition (LPCVD) and sputtering. Thereafter, a patterned mask layer (not shown) is formed over the semiconductor substrate 100. The patterned mask layer exposes the periphery circuit area 100b and a portion of the conductive layer 130 disposed above the remaining dielectric layer 128 in the memory array area 100a. The exposed conductive layer 130 in both the periphery circuit area 100b and in the memory array area 100a is removed. The removal of the exposed conductive layer 130 in the memory array area 100a exposes a part of the remaining dielectric layer 128. The removal of the conductive layer 130 is accomplished through dry etching, for example. In addition, the conductive layer 118 underneath the conductive layer 130 in periphery circuit area 100b is also removed until the dielectric layer 114 is reached. Thereafter, the patterned mask layer (not shown) is removed.

Still referring to FIGS. 1H and 1H', a dielectric layer 132 is then formed over the semiconductor substrate 100. The dielectric layer 132 is formed over the remaining conductive layer 130 and the exposed dielectric layer 128 in memory array area 100a and over the dielectric layer 114 in the periphery circuit area 100b. The dielectric layer 132 may serve as an inter-gate dielectric layer for the subsequently formed memory devices, for example. The dielectric layer 132 is formed with but not limited to an oxide-nitride-oxide (ONO) film, which includes a silicon nitride film sandwiched between a top oxide film and a bottom oxide film. The dielectric layer 132 is formed by deposition methods to a thickness of about 150-250 angstroms, for example. Thereafter, a conductive layer 134 is formed over the dielectric layer 132. In this embodiment, a material that constitutes the conductive layer 134 includes polysilicon. The conductive layer 134 is formed by methods including but not limited to chemical vapor deposition (CVD), low pressure chemical vapor deposition (LPCVD) and sputtering, for example. In this embodiment, the conductive layer 134 is formed immediately after the dielectric layer 132. In essence, the dielectric layer 132 can be protected by the conductive layer 134 from being damaged during the later performed process steps, for example, from photoresistance or unwanted oxide growth.

Figure 1I:
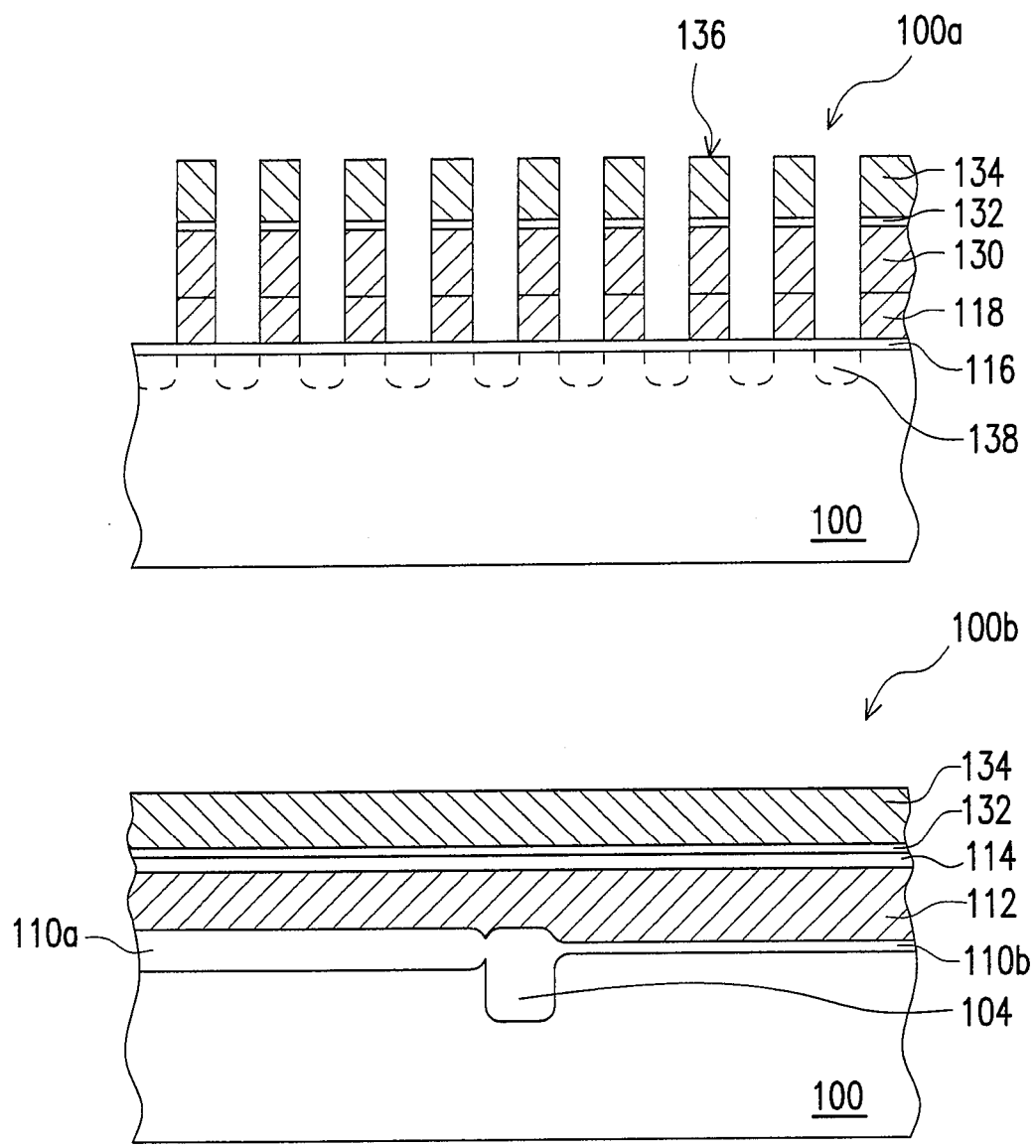

Continuing to FIG. 1I, the conductive layer 134, the dielectric layer 132, the conductive layer 130 and the conductive layer 118 in the memory array area 100a are then defined to form multiple rows and columns of memory devices 136. Thereafter, an implantation process is performed in the substrate 100 to form an impurity layer 138 beside both sides of the memory devices 136. The implantation process is an isolation implantation, for example. The dopants used for the implantation process include, for example, P-type dopants.

Figure 1J:
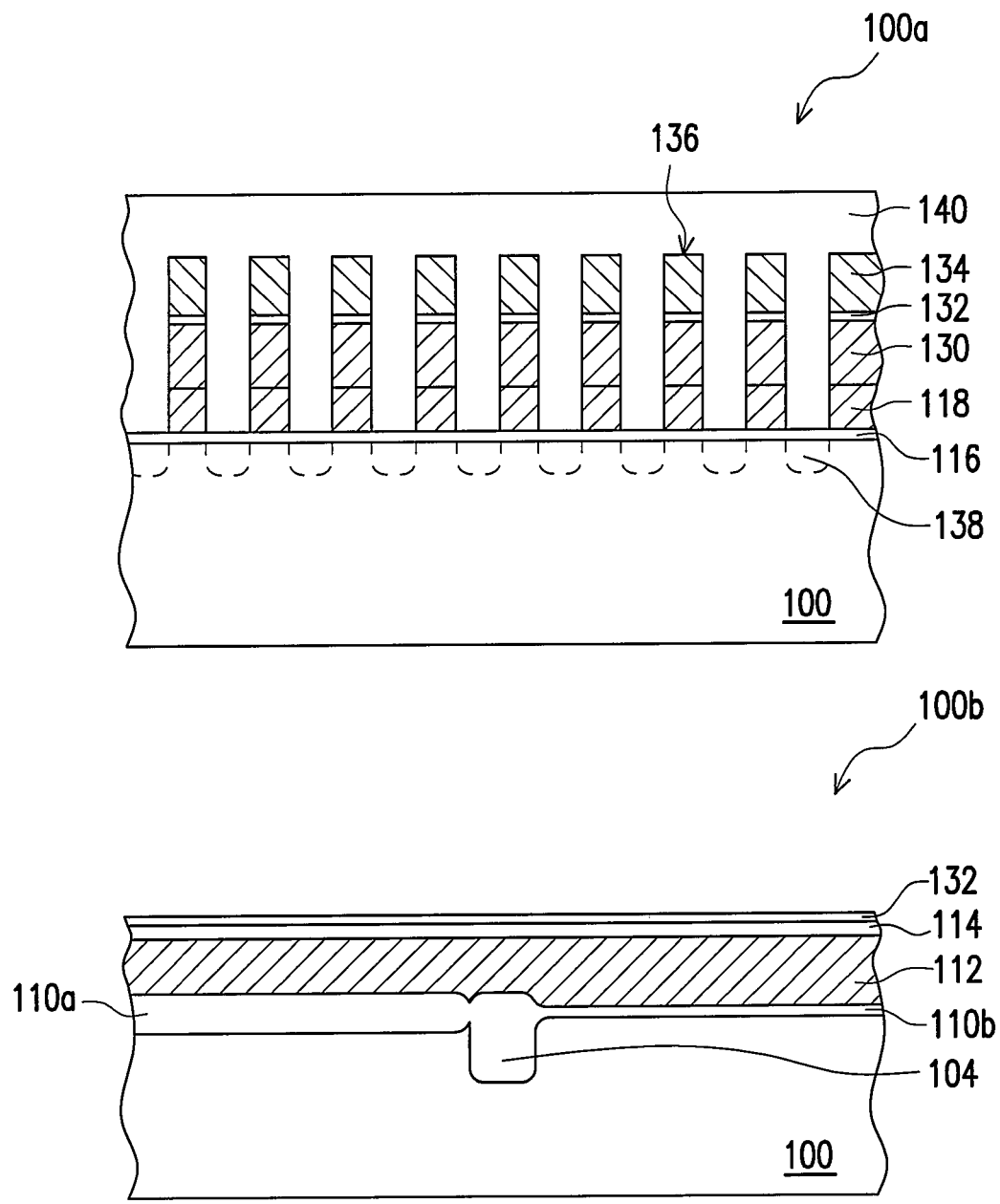

Referring to FIG. 1J, a patterned mask 140 is formed over the semiconductor substrate 100 to conceal the memory array area 100a. The exposed conductive layer 134 in the periphery circuit area 100b is then removed.

Figure 1K:
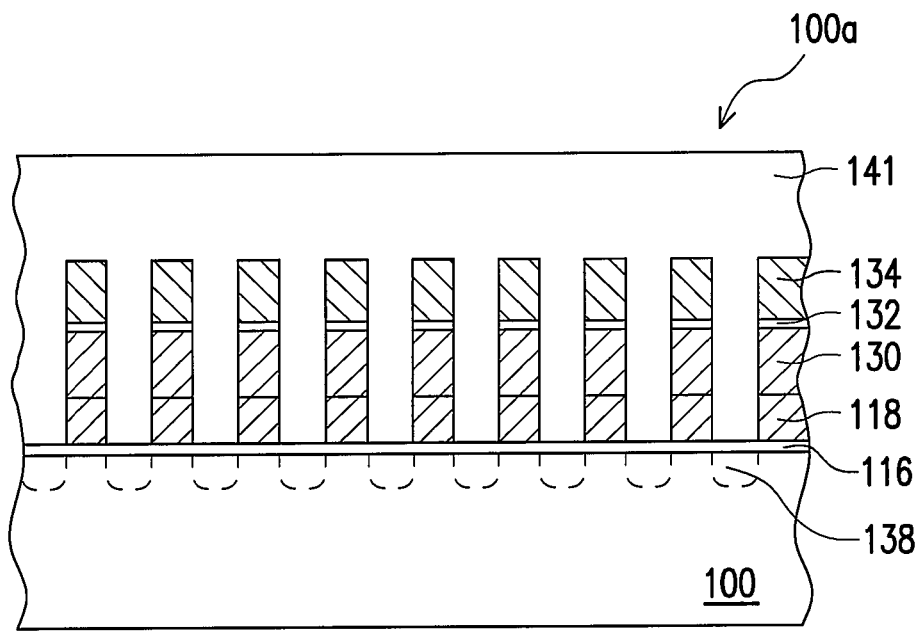
Figure 1K:
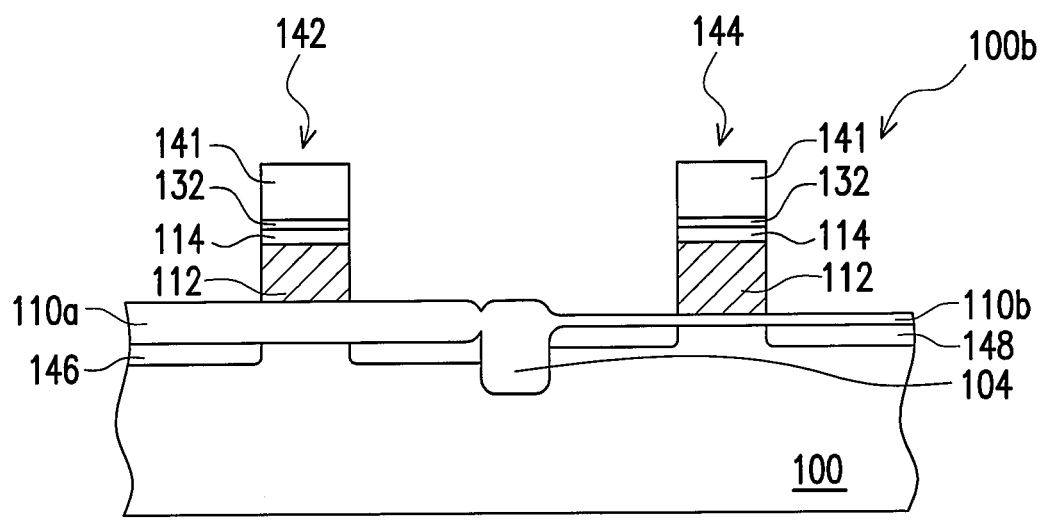

Referring to FIG. 1K, by applying the same photoresist mask 115 used in the removal of the dielectric layer 114 and the underlying conductive layer 112 in the memory array area 100a as shown in FIG. 1C, a photoresist layer 141 is defined. The photoresist layer 141 is, for example, a negative photoresist. In the steps of removing the dielectric layer 114 and the underlying conductive layer 112 in the memory array area 100a, the photoresist mask 115 is used to define a positive photoresist. That is, the step for removing a portion of the dielectric layer 114 shown in FIG. 1C and the step for defining the photoresist layer 141 use the same photoresist mask 115 but with the use of photoresists having different exposure properties. When the photoresist layer 141 is disposed over the semiconductor substrate 100, the photoresist layer 141 conceals the memory array area 100a and exposes the periphery circuit area 100b.

Using the photoresist layer 141 as a mask, the conductive layer 134 in the periphery circuit area 100b is removed. Thereafter, the dielectric layer 132, the dielectric layer 114 and the conductive layer 112 in the periphery circuit area 100b are patterned to form at least one high voltage transistor gate 142 and at least one low voltage transistor gate 144 as shown in FIG. 1K Lightly doped drains 146, 148 are further formed in the substrate 100 adjacent to the sides of the gates 142, 144, respectively. The lightly doped drains 146, 148 are formed by performing an ion implantation processes, for example.

Figure 1L:
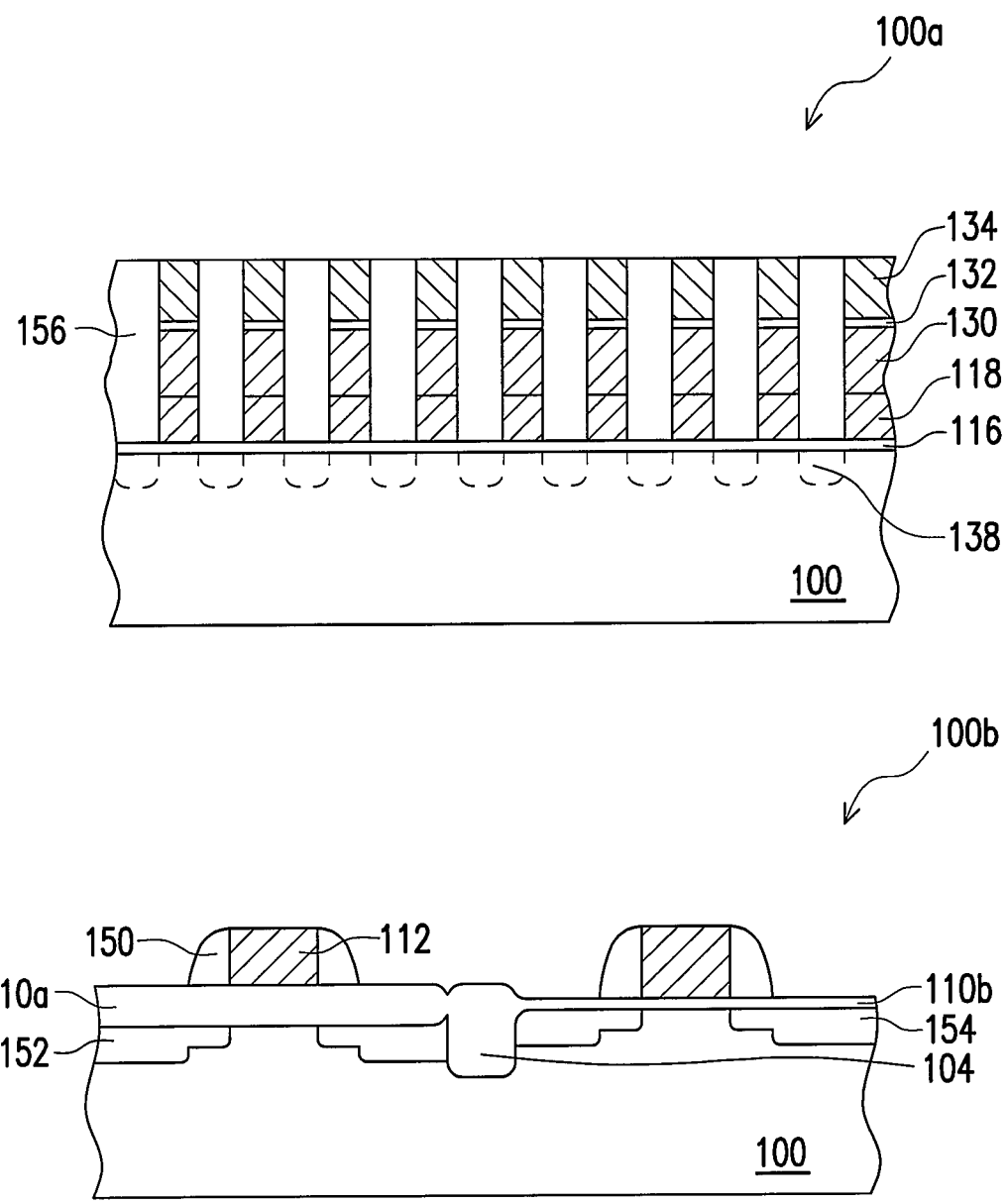

As shown in FIG. 1L, spacers 150 are formed on the respective sidewalls of the gates 142, 144, and source/drain regions 152, 154 are formed in the substrate 100 respectively adjacent to the gates 142, 144 in the periphery circuit area 100b. The dielectric layer 114 and the dielectric layer 132 on the top surfaces of the high voltage transistor gates 142 and the low voltage transistor gates 144 may also be removed during the fabrication of the spacers. Further, a dielectric layer 156 is formed on the semiconductor substrate 100 above the impurity layer 138 beside both sides of the memory devices 136 in memory array area 100a. It should be understood that the fabrication of the memory is subsequently completed by resorting to known techniques and thus will not be reiterated herein.

Figure 2:
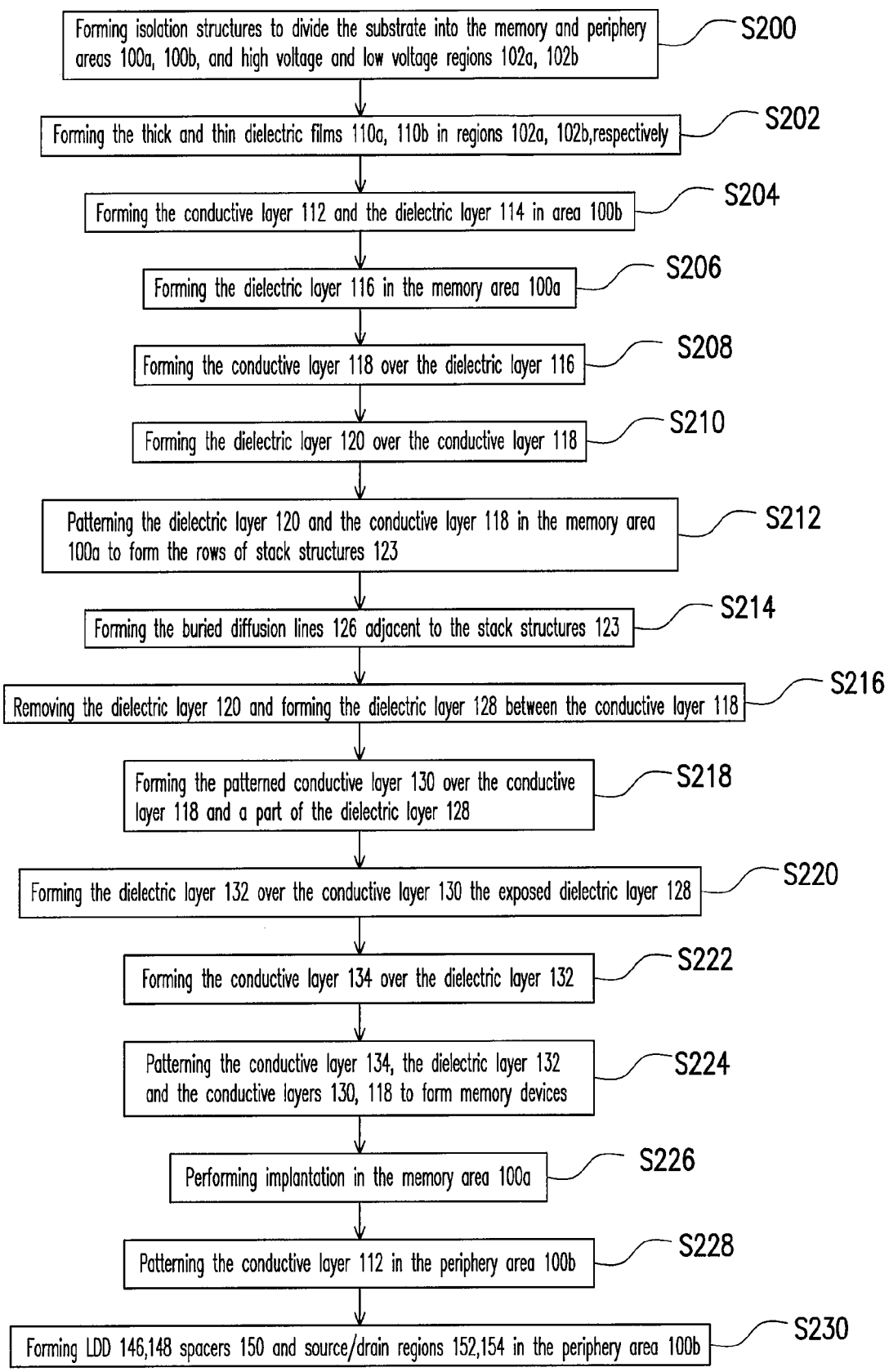
FIG. 2 is a flow chart of steps in exemplary processes that may be used in the fabrication of a memory comprising a memory array area and a periphery circuit array according to one embodiment of the present invention.

FIG. 2 is a flow chart of steps in exemplary processes that may be used in the fabrication of a memory comprising a memory array area and a periphery circuit array according to one embodiment of the present invention. The same reference numbers are used in the flow chart shown in FIG. 2 and in the description illustrated by FIGS. 1A-1K to refer to the same or like parts. Referring to FIG. 2, isolation structures 104 are formed to divide the semiconductor substrate 100 into the memory array area 100a and the periphery circuit area 100b and to further divide the periphery circuit area 100a into at least a high voltage transistor region (HV) 102a and a low voltage transistor region 102b as shown in step S200. The thick dielectric film 110a is then formed in the high voltage transistor region 102a of the periphery circuit area 100b, followed by forming the thin dielectric film in 110b the low voltage transistor region 102b in step S202. In step S204, a conductive layer 112 and a dielectric layer 114 are sequentially formed over the semiconductor substrate 100 in the periphery circuit area 100b Continuing to step S206, the dielectric layer 116 is formed over the substrate 100 of the memory array area 100a, followed by forming a conductive layer 118 over the dielectric layer 116 (step S208). Thereafter, the dielectric layer 120 is formed over the conductive layer 118 (step S210). The dielectric layer 120 and the conductive layer 118 in the memory array area 100a are then patterned to form the plurality of rows of stack structures in step S212. The plurality of buried diffusion lines 126 are then formed in the substrate 100 adjacent to the stack structures 123 as shown in step S214. After this, the dielectric layer 120 of the stack structures 123 is removed and the dielectric layer 128 is formed between the conductive layer 118 of the stack structures in the memory array area 100a (step S216). Then, the patterned conductive layer 130 may form to cover the conductive layer 118 and the dielectric layer 128 in the memory array area 100a, wherein the conductive layer 130 is patterned to expose a portion of the dielectric layer 128 in step S218. The dielectric layer 132 is further formed over the surfaces of the conductive layer 130 and the exposed dielectric layer 128 (step S220). Thereafter, in step 222, the conductive layer 134 is formed over the dielectric layer 132. In step 224, the conductive layer 134, the dielectric layer 132 and the conductive layers 130, 118 are patterned to form the plurality of rows and columns of memory devices 136, and an implantation is performed to form impurity layers 138 beside both sides of the memory devices as in step S226. In step 228, the conductive layer 112 in the periphery circuit area 100b is patterned to form the high voltage transistor gates 142 and the low voltage transistor gates 144. Thereafter, in step S230, the light doped drains 146, 148 (LDD), the spacers 150 and the source/drain regions 152, 154 are respectively formed in the periphery circuit area 100b.

In the invention, the buried diffusion region is formed subsequent to the formation of the gate dielectric films of the high voltage transistor devices and the low voltage transistor devices. The buried diffusion region is thus prevented from being affected by the thermal process used in forming the gate dielectric films. In other words, the buried diffusion region is prevented from expanding due to the high thermal budget process used in forming the thick gate dielectric film of the high voltage transistor devices in the periphery circuit area. Accordingly, even the size of the cell of the memory device is further reduced the short channel effect is minimized. Moreover, the device characteristics of the memory can be better controlled.

Additionally, in the present invention, subsequent to the formation of the ONO dielectric layer 132, the conductive layer 134 is next formed over the ONO dielectric layer 132. The ONO dielectric layer 132, which may serve as the inter-gate dielectric layer between the floating gate and the control gate, is readily covered by the conductive layer 134. Accordingly, the inter-gate dielectric layer is prevented from being compromised by being exposed to other processes of the fabrication of the memory, for example being damaged by the cleaning solution, photoresistance or unwanted oxide growth. Therefore, the quality and the property of the inter-gate dielectric layer are better preserved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for fabricating a memory, the method comprising:

providing a substrate having a memory area and a non-memory area, wherein the non-memory area comprises at least a first voltage region and a second voltage region;

forming a first dielectric layer in the non-memory area, wherein a first thickness of the first dielectric layer in the first voltage region is greater than a second thickness of the first dielectric layer in the second voltage region;

forming a first conductive layer over the first dielectric layer in the non-memory area;

forming thereafter a second dielectric layer in the memory area;

forming sequentially a second conductive layer and a third dielectric layer in the memory area;

forming a plurality of rows of stack structures in the memory area by patterning the third dielectric layer and the second conductive layer, wherein a space is configured between every two adjacent rows of stack structures;

forming a plurality of buried diffusion regions in the substrate adjacent to sides of the rows of the stack structures;

forming a fourth dielectric layer filling the space between the rows of stack structures;

forming a fifth dielectric layer over the second conductive layer and the fourth dielectric layer in the memory area;

forming a third conductive layer over the fifth dielectric layer; and patterning the third conductive layer, the fifth dielectric layer, and the second conductive layer to form a plurality of memory devices in the memory area.

2. The method of claim 1 further comprising patterning the first conductive to form at least a transistor gate in the non-memory area.

3. The method of claim 1 further comprising forming an impurity layer in the substrate beside the sides of the memory devices.

4. The method of claim 1, wherein the first dielectric layer is formed by performing a thermal process.

5. The method of claim 1, wherein the buried diffusion regions are formed by implanting dopants in the substrate.

* * * * *